United States Patent

White et al.

[11] Patent Number: 6,090,247
[45] Date of Patent: *Jul. 18, 2000

[54] APPARATUS FOR COATING SUBSTRATES

[75] Inventors: Norman Henry White; Allen Robert Waugh; Alarie Graham Spencer; John Michael Walls; Hussein J'Afer, all of Whitwick, United Kingdom

[73] Assignee: Applied Vision Limited, Leics, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/549,857
[22] PCT Filed: Mar. 20, 1995
[86] PCT No.: PCT/GB95/00607
  § 371 Date: Nov. 17, 1995
  § 102(e) Date: Nov. 17, 1995
[87] PCT Pub. No.: WO95/25828
  PCT Pub. Date: Sep. 28, 1995

[30] Foreign Application Priority Data

Mar. 19, 1994 [GB] United Kingdom ............... 9405442

[51] Int. Cl.$^7$ .................................................. C23C 14/34
[52] U.S. Cl. ................. 204/298.26; 204/298.07; 204/298.08; 204/298.19; 204/298.23; 204/298.25; 204/298.28; 118/719; 118/723 E; 118/730; 118/723 MP
[58] Field of Search .................. 204/298.07, 298.08, 204/298.16, 298.19, 298.23, 298.25, 298.26, 298.27, 298.28; 118/719, 723 MP, 723 MW, 723 ME, 723 MR, 723 MA, 723 E, 730; 156/345

[56] References Cited

U.S. PATENT DOCUMENTS

| | | | |
|---|---|---|---|
| 4,724,296 | 2/1988 | Morley | 156/345 |
| 5,169,509 | 12/1992 | Latz et al. | 204/298.08 |
| 5,211,759 | 5/1993 | Zimmerman et al. | 118/730 |
| 5,415,757 | 5/1995 | Szcyrbowski et al. | 204/29.08 |

FOREIGN PATENT DOCUMENTS

| | | | |
|---|---|---|---|
| WO91/14797 | 10/1991 | WIPO | 204/298.05 |
| WO92/13114 | 1/1992 | WIPO . | |

*Primary Examiner*—Rodney G. McDonald
*Attorney, Agent, or Firm*—Zarley, McKee, Thomte, Voorhees & Sease

[57] ABSTRACT

The current invention relates to the provision of apparatus for depositing layers of material onto substrates (2) mounted on a carrier (4) all provided in a vacuum chamber (6) wherein the material is deposited by sputtering of targets of the material from activated magnetrons (7, 7') and the deposited material is reacted by providing a reaction producing means (9) which allows the coating material on the substrates to be conditioned to have the required characteristics. The invention provides that any, or any combination, of the material depositing means and/or reaction producing means are formed from either two magnetrons or a magnetron and counter electrode arrangement which are powered by an alternating voltage power supply which allows a reduction in the occurence of arcing and thereby the dimensions of the apparatus in comparison to conventional apparatus can be substantially reduced.

16 Claims, 2 Drawing Sheets

APPARATUS FOR COATING SUBSTRATES

The invention of this application relates to apparatus for the coating of substrates such as, but not exclusively, optical lens. The coating process involves the deposition of material onto the substrates and reaction of the material to form a single or multilayered coating with required properties thereon.

There are many conventional deposition apparatus which provide means whereby a material can be deposited onto a substrate to provide a desired beneficial effect thereon. One application where the use of deposition apparatus is particularly effective is with respect to the provision of anti reflective coatings on optical lens. Apparatus for this form of coating is disclosed in the applicant's co-pending Application no. WO9213114.

In this apparatus the substrates are held on a disc which is rotated relative to a number of material deposition means and reaction producing means mounted in proximity to the disc for the deposition of sputtered material onto the substrates and reaction of the same. Typically a multilayered coating is required to be provided and such a coating can be formed by the alternate operation of material deposition means each of which is formed by a magnetron, one of which contains a target of, for example, silicon and the other contains a target of, for example, titanium. With the provision of a third unbalanced magnetron this forms the reaction producing means and, if operated in oxygen, causes an oxygen plasma to be created in the vacuum chamber in which the coating takes place and the desired multilayer coating of Si O2 and Ti O2 can be achieved on a plurality of substrates.

As an alternative to mounting the substrates on a disc for rotation it is disclosed in Patent application no. EP0328257 that the substrates can be mounted on the sides of a drum such that the drum is rotatable and the magnetrons which are provided to sputter material onto the substrates are provided adjacent to the drum and lie in the vertical axis on the walls of the chamber in which the substrate carrier rotates.

This form of apparatus is an adaptation and development of the earlier disclosure by Schiller and Hartsough U.S. Pat. No. 4,420,385. The European patent application discloses the provision of deposition and reaction in long narrow axial zones with respect to the substrate drum carrier and thereby the reaction is effected by an ion source in a highly reactive longitudinal zone and physically separating this zone from the material deposition zones by means of a region of relatively low pressure. The use of selective shuttering of the deposition material magnetrons is also disclosed whereby when a magnetron is not in use the same is covered by a shutter to prevent the occurrence of any reaction with the target.

Due to the requirement to physically separate the deposition and reaction zones in this known apparatus it is necessary for the drum on which the substrates are mounted to be relatively large so that the necessary physical distance between the reaction and deposition zones can be achieved. It is also necessary to use relatively large vacuum producing means and these features cause the apparatus to be relatively bulky.

The conventional apparatus utilise DC power supplied to activate and drive the magnetrons and reaction means. The use of DC power can lead to arcing caused by the partial oxidation of the target and hence the physical separation between the magnetrons and reaction areas in conventional apparatus is required to be sufficient to discourage the occurrence of arcing. This again adds considerably to the physical size of the apparatus.

The aim of the present invention is to provide a machine for the deposition of material onto substrates in a manner which allows the size of the machine to be kept to a minimum and thereby allow the economic coating of relatively small batches of substrates.

The present invention provides apparatus for the deposition of material onto at least one substrate, said apparatus comprising a vacuum chamber, a vacuum creating means, at least a first material deposition means, at least a first reaction producing means, a means for introducing gas or gases into the chamber, and a substrate carrier mounted for rotation in the vacuum chamber and characterised in that at least one of the material depositing means and/or reaction means comprises at least one magnetron and a further magnetron or a counter electrode which are powered by an alternating voltage power supply.

Typically the said magnetrons or counter electrode and magnetron are mounted in a vertical or horizontal plane in the chamber and facing inwardly toward the substrate carrier.

In one embodiment the material deposition means comprises two magnetrons arranged side by side on the chamber wall. In operation, at any one instant, one of the magnetrons is operated with a positive bias and the other with a negative bias to sputter material onto the substrates on the carrier; the negative and positive biases of the two magnetrons are exchanged periodically and synchronously by the alternating voltage power supply.

If the reaction producing means is driven by alternating voltage power supply then the plasma source therein can, in one embodiment, comprise two unbalanced magnetrons arranged side by side and again one is operated with a positive bias and the other is operated with a negative bias at any one instant, the polarities being exchanged periodically. The frequency of the supply can, for example, be in the region of 30–40 kHz.

In an alternative embodiment the reaction producing means is formed by an unbalanced magnetron and a counter electrode wherein one half of the alternating voltage cycle powers the magnetron and the other half cycle is received by the counter electrode. One of the magnetron or the counter electrode will have a positive bias and the other a negative bias and these can be periodically and synchronously reversed during operation. In one embodiment the vacuum chamber may act as the counter electrode.

It is possible that only one of the material depositing means is formed of two side by side magnetrons powered by an alternating voltage power supply or alternatively all, or any combination of, the reaction producing means and material depositing means are powered by an alternating voltage power supply and, if a combination, the remainder are powered by d.c. power supplies.

The use of side by side magnetrons or a magnetron and counter electrode arrangement powered by alternating voltage power supply allows one to be operated with a negative polarity and the other with a positive polarity during operation and this is found to reduce and typically eliminate arcing of the magnetrons. Although the use of alternating voltage power supplies is known in conventional reactive sputtering, the use in relation to apparatus which includes a metal deposition and a separate reaction zone with at least one of the same formed by at least two side by side magnetrons or by a magnetron and a counter electrode is novel and the particular advantages which can be gained from its use are not previously disclosed or expected. As the metal which is deposited onto the substrates is sputtered with a relatively small amount of reactive gas in the vicinity, the size of the apparatus can be substantially reduced as the requirement to physically separate zones of reaction and deposition are eliminated as no arcing occurs.

Furthermore the plasma generated from a plasma source of the reaction producing means using an alternating voltage power supply is found to be of greater density than that created in conventional dc powered plasma sources and has higher energy. This increases the oxidation rate and efficiency which in turn increases the speed of coating the substrates. Secondly, higher energies also result in better quality films due to greater densification of the coating i.e. 40 eV to 100 eV are the optimum conditions.

Reference herein is made to the use of alternating voltage power supplies and it is envisaged that the use of alternating voltage supplies to power the material depositing means and/or reaction producing means with the alternating voltage having a frequency in the range of 1 kHz to 1 MHz is feasible. It has been found that a preferred, but not exclusive, range of frequency of operation is between 30 to 50 kHz.

In a further aspect of the invention, as an alternative to using alternating voltage supply, alternating current is used. When alternating current is used in conjunction with one material depositing means and a reaction producing means, a first, half cycle of each cycle of the power supply is used to power the material depositing means and the second half cycle is used to power the reaction producing means. Where two depositing means are provided the power supply half cycle can be switched between the material depositing means as required to provide the required activation of the depositing means to produce multilayered coatings on the substrates.

Typically the reaction producing means creates an oxygen plasma generated by a plasma source in the form of an unbalanced magnetron with either another unbalanced magnetron or counter electrode operated in oxygen. Use of the unbalanced magnetron causes the release of activated oxygen which reacts with the deposited material to form a metal oxide coating on the substrate.

Alternatively, coatings of any of metal nitrides, hydrides or a carbon containing compound or mixtures are created as opposed to metal oxides to suit particular requirements by replacing the oxygen with a suitable gas or gas mixture.

Preferably the substrate carrier, with the substrates mounted thereon, can be loaded into the chamber via a loadlock device thereby preventing the magnetrons from being exposed to atmospheric pressure. The loadlock is in one embodiment an adaptation of the loadlock device disclosed in the applicant's co-pending application no. WO9213114 wherein the substrates are mounted from a magazine onto the carrier in the vacuum chamber.

In an alternative and preferred embodiment for apparatus of smaller size the substrates are loaded onto the substrate carrier and the carrier is then moved from a loading chamber through the load lock into position in the vacuum chamber for the deposition of coating layers thereon. This allows the substrates to be loaded relatively easily and speeds up the operation of loading of the same.

The main advantage is that the vacuum chamber is not exposed to air at atmospheric pressure and because it is under vacuum, the magnetrons and targets therein are not oxidised and do not require physical separation to the extent required in conventional apparatus and do not require the use of shutters or preconditioning.

Preferably the material depositing means are provided to allow the deposition of two different materials and are operable at different times to produce a multilayered coating on the substrates. Typically the magnetrons have targets of any suitable metal such as silicon, titanium, zirconium, niobium. The reaction zone is defined by providing at least one unbalanced magnetron to emit an oxygen plasma into the reaction zone through which the carrier passes.

A specific embodiment of one type of coating apparatus incorporating the invention is now described with reference to the accompanying drawings wherein.

Figure 1:
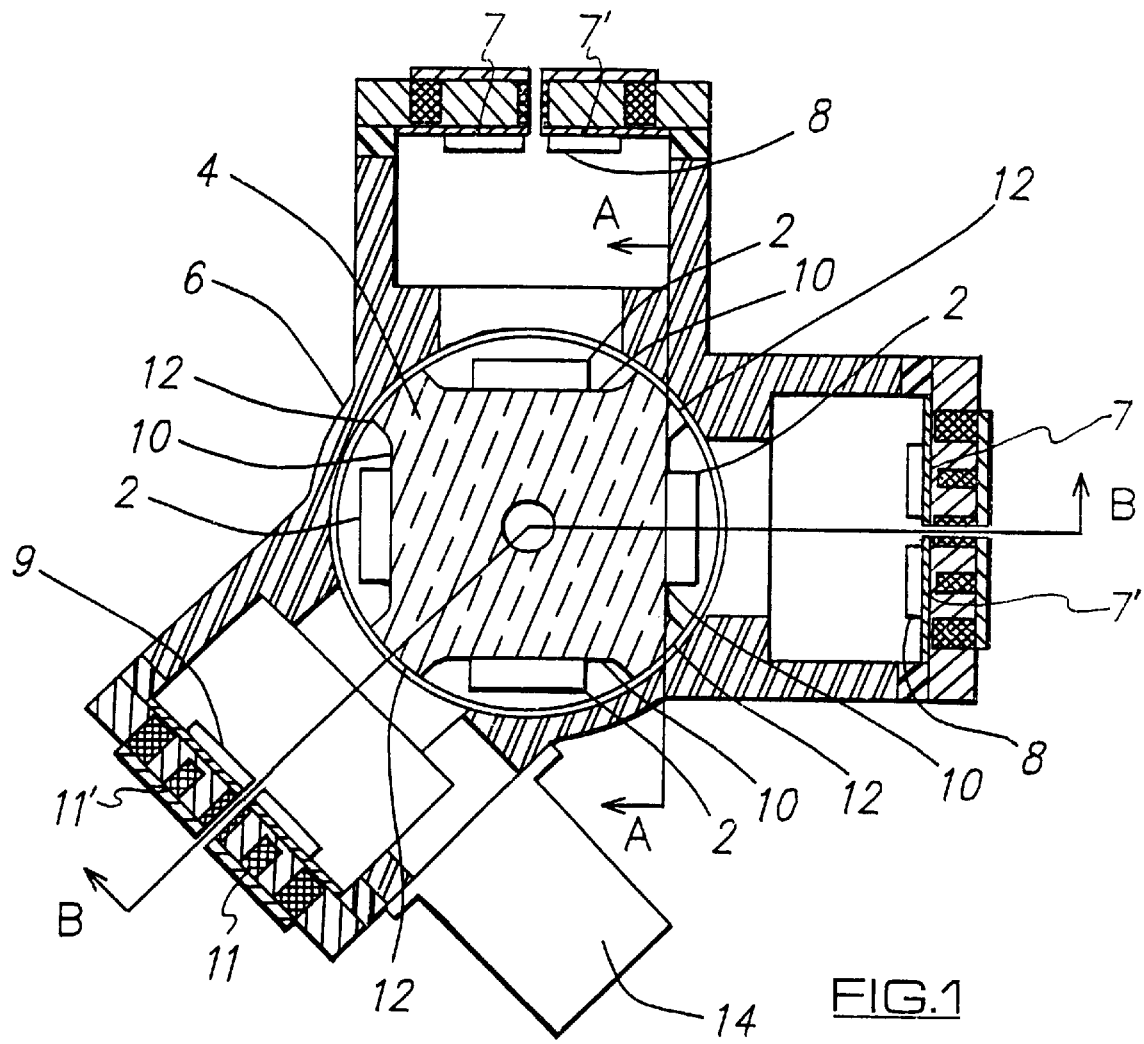
FIG. 1 illustrates a plan view of the apparatus of the invention with the top removed.

Referring firstly to FIG. 1 there is shown apparatus for the coating of a plurality of substrates 2. The substrates 2 are mounted on a substrate carrier 4 which in turn is mounted for rotation in a vacuum chamber 6. The chamber is provided with two material depositing means 8 mounted on the side walls of the chamber and facing inwardly toward the substrate carrier 4 for the deposition of material onto the substrates 2. The material is deposited by the sputtering of material from a target of the desired material mounted in the depositing means onto the substrates 2 to coat the same. In this embodiment both of the material depositing means 8 are operated by alternating voltage power supply and each material depositing means 8 is split and includes two magnetrons 7,7' which are arranged side by side and, at any one instant during operation, one is powered by the alternating voltage power supply to operate under a positive bias and the other is arranged to operate under a negative bias; the biases are periodically and synchronously changed in polarity by the alternating voltage power supply.

The reaction producing means 9 includes a plasma source in the form, in this embodiment, of an unbalanced magnetron arrangement which is also driven by an alternating voltage power supply control and the arrangement comprises two side by side unbalanced magnetrons 11, 11' which are arranged to operate under positive and negative bias respectively. When the reaction means are operated in a desired gas, such as oxygen, which is introduced into the chamber adjacent the same, an oxygen plasma is created which, upon contact with the sputtered material on the substrates, creates an oxide coating.

The provision of the material depositing means and the reaction producing means in the arrangements so described and operation of the same by alternating voltage power supply eliminates the problem of arcing in deposition and/or reaction zones, the prevalence of which in conventional machines requires the physical isolation or separation of the zones.

As an alternative arrangement to the embodiment shown one of the magnetrons in the reaction producing means 11,11' or material depositing means 7,7' may be replaced by a counter electrode such that one cycle of the alternating voltage power supply powers the magnetron in the means and the other half cycle is received by the counter electrode thus allowing the same coating effect and advantages to be obtained with only one magnetron in the means.

The substrate carrier 4 is, in this embodiment, substantially in the form of a cube and the substrates 2 are mounted on the vertical faces 10 of the same. The carrier, in this embodiment, is also provided with four corner edges and these edges form gas partitioning vanes 12. In order for the vanes 12 to be effective the substrate carrier 4 is mounted for rotation about its central vertical axis and the chamber 6 is constructed such that the vanes, as the carrier 4 rotates, pass in close proximity to the walls of the chamber 6 thus preventing the easy flow of gases between the zones.

The vacuum chamber 6 is also provided with a vacuum pump 14 connected thereto to cause the chamber to be under vacuum during use.

Figure 2:
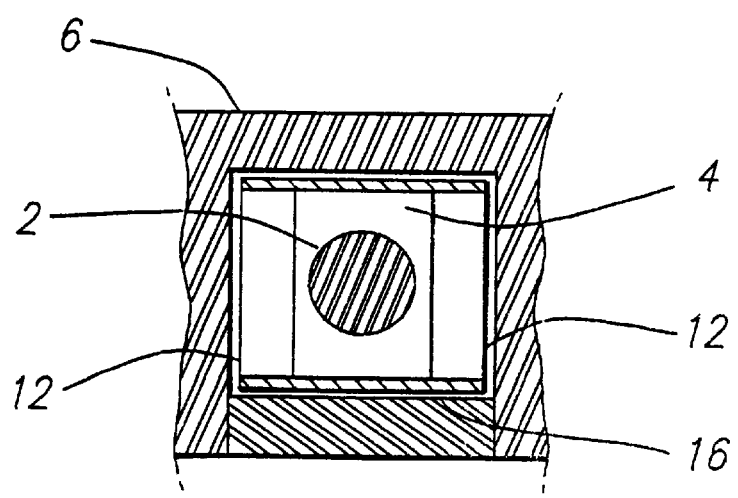
FIG. 2 illustrates a sectional elevation of the vacuum chamber through the line AA of FIG. 1.

Referring now to FIG. 2 there is shown a sectional view into the vacuum chamber 6 on line A—A showing the substrate carrier 4 with a substrate 2 mounted thereon. The carrier 4 is mounted for rotation about the central axis 16 by a drive means (not shown) and, as it does so, the vanes 12 rotate in close proximity to the walls of the vacuum chamber 6.

Figure 3:
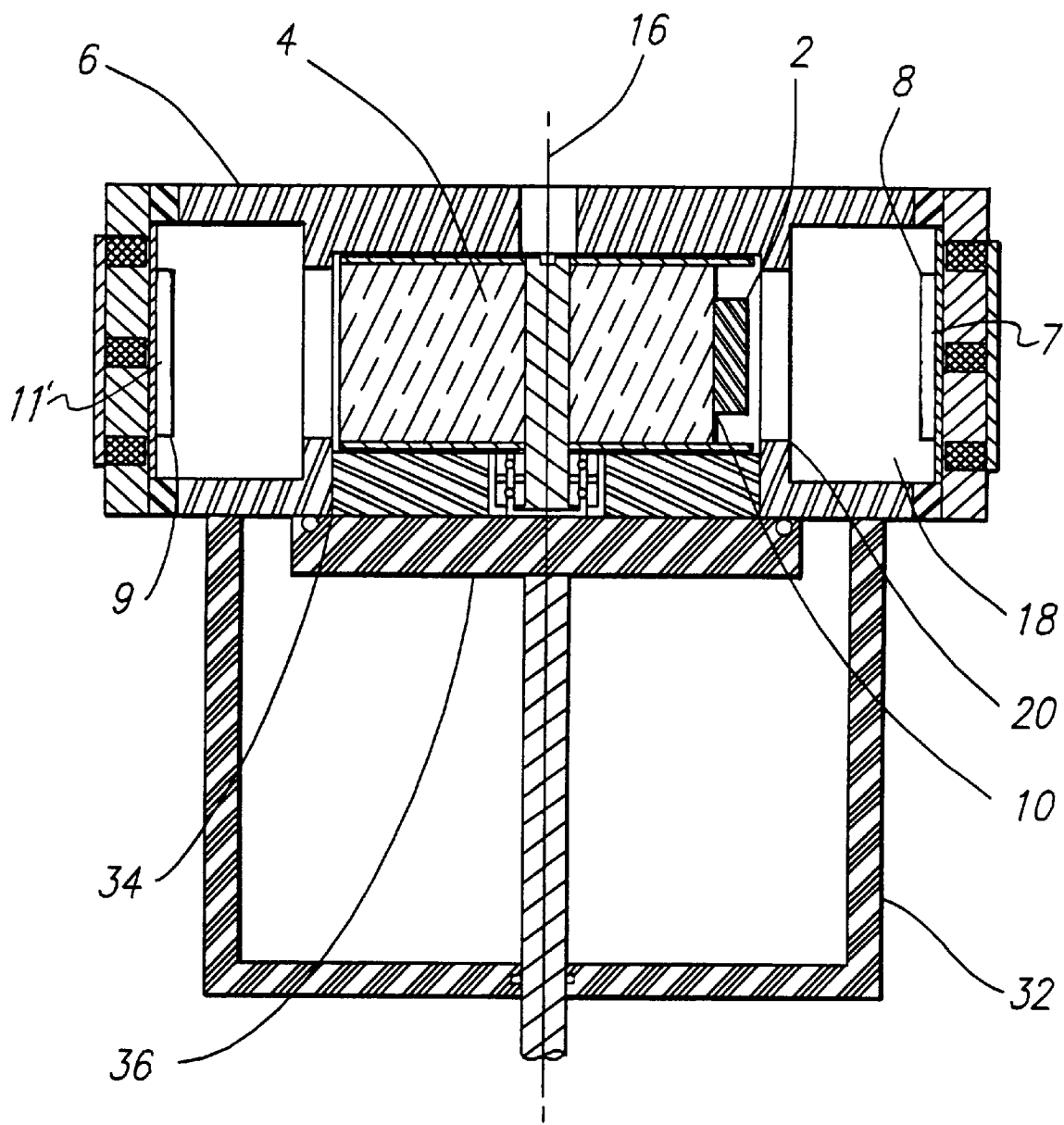
FIG. 3 illustrates a sectional elevation through the line BB of FIG. 1.

FIG. 3 illustrates a sectional elevation through the apparatus and shows the carrier 4, the vacuum chamber 6, one of the material depositing means 8 and the reaction means 9. The carrier 4 is shown carrying a substrate 2 on each of the sides 10. The material depositing means 8 is mounted in an area 18 of the chamber 6 and there is defined an aperture 20 which allows the material sputtered from the magnetrons 7, 7' to pass onto the substrates 2 on the carrier 4 and the shape of the aperture 20 can be used to define the shape and pattern of sputtered material deposited.

Also shown is the provision of a loading chamber 32 which is shown below the vacuum chamber 6 in FIG. 3. The loading chamber 32 and vacuum chamber are interconnected via an aperture 34 which is selectively openable by operation of a sealing plate 36. The provision of this chamber is to allow the carrier 4 with substrates 2 mounted thereon to be loaded and unloaded from the vacuum chamber whilst maintaining the vacuum in the vacuum chamber and thereby preventing damage to the reaction and material depositing means situated therein. While the above apparatus is described in detail it should be understood that the apparatus in the configuration shown represents only one of the possible configurations of apparatus where the use of alternating voltage power supply is of advantage. The use of alternating voltage power supplies is of advantage in any apparatus where separate reaction zones and material depositing zones are used such as, for example, the apparatus described in co-pending application no. WO9213114. The operation of the apparatus of the type so described, and, in general, apparatus for the coating of substrates mounted on a carrier for rotation past deposition and reaction zones, using alternating voltage power supplies to drive the reaction producing means and/or material deposition means has considerable and unexpected advantage in that firstly, the problem of arcing is eliminated, the speed of coating substrates can be increased and furthermore the reduction of arcing allows the physical size of the apparatus to be reduced as there is no longer any requirement for the degree of physical separation of zones as in the conventional apparatus. Furthermore complex and mechanically inefficient shuttering arrangements are not required and this further allows the size of the apparatus to be reduced thereby allowing the apparatus to be economically viable for use in the coating of relatively small batches of substrates.

What is claimed is:

1. An apparatus for the deposition of material onto at least one substrate to form a coating, said apparatus comprising:

a vacuum chamber;

a vacuum creating means;

a material deposition means to deposit material in a first area of the vacuum chamber onto the at least one substrate;

characterized by:

a reaction producing means to create a plasma in a separate, second area of the vacuum chamber;

a means for introducing a gas into the chamber;

a substrate carrier mounted for rotation in the vacuum chamber to carry the at least one substrate from the first area to the separate, second area; and the reaction producing means being a plasma source comprising a first unbalanced magnetron and a conductive means for receiving alternating voltage power, the conductive means being selected from the group consisting of a second unbalanced magnetron and a counter electrode, the first unbalanced magnetron and said conductive means for receiving alternating voltage power being arranged side by side and powered by an alternating voltage power supply such that at any one instant during the operation one of the first unbalanced magnetron and the conductive means operates with a negative bias and the other of the first unbalanced magnetron and the conductive means operates with a positive bias to generate a plasma in the second area of the vacuum chamber to cause a reaction of material previously deposited by the material deposition means on the at least one substrate, and whereby the negative bias and the positive bias can be periodically and synchronously changed during operation.

2. The apparatus of claim 1 wherein the conductive means is a second unbalanced magnetron.

3. The apparatus of claim 1, wherein the conductive means is a counter electrode.

4. The apparatus of claim 1 wherein the material deposition means comprises first and second unbalanced magnetrons.

5. The apparatus of claim 1 wherein the material deposition means comprises first and second magnetrons which include targets of an appropriate material to be sputtered onto the at least one substrate.

6. The apparatus of claim 1 wherein the material deposition means comprises first and second unbalanced magnetrons which are mounted in a vertical plane in the vacuum chamber and facing inwardly toward the substrate carrier.

7. The apparatus of claim 1 wherein the material deposition means comprises a first unbalanced magnetron and a counter electrode.

8. The apparatus of claim 1 wherein the reaction producing means is operated in a gas.

9. The apparatus of claim 8 wherein the gas is selected from the set of oxygen, hydrogen, nitrogen, and methane gas.

10. The apparatus of claim 8 wherein in that the reaction producing means is operated in a gas to produce a carbon containing compound coating on the at least one substrate.

11. The apparatus of claim 1 wherein the gas is a mixture of at least two gases selected from the set of oxygen, hydrogen, nitrogen and methane gas.

12. The apparatus of claim 1 wherein the substrate carrier, with the at least one substrate mounted thereon, can be loaded in the chamber via a loadlock device thereby maintaining the vacuum in the vacuum chamber and preventing the reaction producing means and the material depositing means from being exposed to atmospheric pressure.

13. The apparatus of claim 1 wherein the at least one substrate is mounted on the carrier external of the vacuum chamber and passed from a loading chamber interconnected and selectively openable into the vacuum chamber.

14. The apparatus of claim 1 wherein two material deposition means are provided, each of the two material deposition means being for deposition of different materials onto the at least one substrate.

15. The apparatus of claim 1 wherein the alternating voltage power supply is operable at any frequency between 1 khz and 1 MHz.

16. The apparatus of claim 15 wherein the alternating voltage power supply is operable at any frequency between 30–50 kHz.

* * * * *